United States Patent [19]

Bezjak

[11] Patent Number: 5,075,624
[45] Date of Patent: Dec. 24, 1991

[54] RADIO FREQUENCY QUADRATURE COIL CONSTRUCTION FOR MAGNETIC RESONANCE IMAGING (MRI) APPARATUS

[75] Inventor: Greg W. Bezjak, Stratford, Conn.

[73] Assignee: North American Philips Corporation, New York, N.Y.

[21] Appl. No.: 530,127

[22] Filed: May 29, 1990

[51] Int. Cl.$^5$ ............................................. G01R 33/20
[52] U.S. Cl. .................................... 324/318; 324/322
[58] Field of Search ................. 333/156; 324/300, 307, 324/318, 322, 314

[56] References Cited

U.S. PATENT DOCUMENTS

| | | | |
|---|---|---|---|
| 4,763,074 | 8/1988 | Fox | 324/314 |
| 4,766,383 | 8/1988 | Fox et al. | 324/318 |
| 4,816,765 | 3/1989 | Boskamp | 324/318 |
| 4,833,429 | 5/1989 | Keren et al. | 333/156 |
| 4,879,516 | 11/1989 | Mehdizadeh et al. | 324/318 |
| 4,882,540 | 11/1989 | Domenick et al. | 324/318 |
| 4,918,388 | 4/1990 | Mehdizadeh et al. | 324/322 |
| 4,931,734 | 6/1990 | Kemner et al. | 324/318 |
| 4,987,370 | 1/1991 | Leussler | 324/318 |
| 4,998,066 | 3/1991 | Wichern | 324/322 |
| 5,030,915 | 7/1991 | Boskamp et al. | 324/318 |

FOREIGN PATENT DOCUMENTS 0142760 11/1984 European Pat. Off. .

OTHER PUBLICATIONS

C. E. Hayes, W. A. Edelstein, J. F. Schneck, O. M. Mueller & M. Eash, "An Efficient, Highly Homogeneous Radiofrequency Coil for Whole-Body NMR Imaging at 1.5 T", Journal of Magnetic Resonance, vol. 63, 1985, pp. 622-628.

Primary Examiner—Michael J. Tokar
Attorney, Agent, or Firm—William Squire

[57] ABSTRACT

A first circular ring of a given inductance is coupled to second and third circular rings by a plurality of equally spaced parallel rods to form a birdcage coil. The second and third rings have a combined inductance the same as that of the first ring and are located adjacent to each other at an end of the rods opposite the first ring. A tune-detune circuit is located at the end of and couples each of the rods to the second and third rings. This circuit includes parallel capacitances whose combined value is the same as the capacitance coupling the rods to the first ring to selectively tune the coil to a given radiofrequency. PIN diodes selectively rf couple the parallel capacitances respectively to the second and third rings. Direct current diode bias voltages are applied to the second and third rings which act as busses for the bias voltages. The second and third rings are split in half and capacitively coupled to permit applying relatively higher (DC) bias voltages to the diodes. The coil is divided into upper and lower halves with open space between the rods of the upper half to permit access to a patient's head and for patient comfort during examination.

21 Claims, 3 Drawing Sheets

RADIO FREQUENCY QUADRATURE COIL CONSTRUCTION FOR MAGNETIC RESONANCE IMAGING (MRI) APPARATUS

This invention relates to a coil construction for use in an MRI system in which a body coil generates a magnetic field and the coil construction senses the magnetic field response of the body for producing quadrature rf signals manifesting that response.

Of interest are copending applications Ser. No. 366,101 filed June 13, 1989 entitled RF Quadrature Coil System for an MRI Apparatus in the name of Leussler et al. now U.S. Pat. No. 4,987,370 and Ser. No. 483,187 filed Feb. 20, 1990 entitled Quadrature Surface Coil for Magnetic Imaging Apparatus in the name of Boskamp et al. now U.S. Pat. No. 5,030,915 and assigned to the assignee of the present invention.

Quadrature coils are widely used to examine specific body parts in an MRI apparatus. Magnetic Resonance Imaging systems are known and described, for example, in European Patent Application 0142760. The phenomena involved occur in atomic nuclei in which due to the spin of protons and neutrons, a magnetic moment is exhibited. When a sample is placed in a static homogeneous magnetic field, nuclear magnetic moments align with the field to produce a net magnetization in the direction of the field. Under the influence of the excitation field, the magnetic moments of the atoms of the sample precess about the axis of the field at a frequency dependent on the strength of the applied magnetic field and the characteristics of the nuclei. The nuclear moments are affected by rf pulses applied by a coil. After a pulse is applied, the moments then realign with the magnetic field. The nuclear moments when realigning produce fields characteristic of the magnetic fields of the nuclei. The same or different coil is then used to sense the fields produced by the nuclei to produce radio-frequency signals in the coil. In nuclear magnetic resonance (NMR) imaging, the NMR signals are used to reconstruct images of the object under examination.

In examining the head, in particular, one known coil construction comprises a so-called birdcage coil. The coil comprises two spaced circular rings coupled by a plurality of parallel spaced rods. Capacitors are connected in circuit with the rods to tune the coil to a given radio frequency. Typically certain of these capacitors are placed centrally in the rods as shown, for example, in the aforementioned European Patent Application and in an article entitled "An Efficient, Highly Homogeneous Radio Frequency Coil for Whole-Body NMR Imaging at 1.5T" by Hayes et al., Journal of Magnetic Resonance Vol. 63, pages 622–628 (1985). The capacitors are centrally placed in the rods of the disclosed structures because it is generally believed that to provide an optimum response, the system should be symmetrical. However, when this coil is a local unit placed within a body coil, the local unit needs to be decoupled from the body coil, otherwise magnetic coupling detunes both coils and the system is not operative. To decouple the local coil, PIN diodes are typically used, a diode being used for each rod. These diodes are also centrally coupled to the rods for symmetry. The diodes require direct current to bias the diodes on when the coil is tuned and to reverse bias the diodes off when the coil is to be detuned. A DC bias network requires rf chokes to preclude rf coupling of the bias network with the rf energy of the coil. The bias network adds bulk to the system and tends to take up the space between the rods generally requiring the birdcage coil to have closed construction.

However, it is desired that a coil be optimized for knee and pediatric head studies at 1.5T. A birdcage coil construction is believed optimum for head studies because such a coil is believed to provide optimum homogeneity. One goal is that the coil operate in a receive only mode. In this mode, all rods of the coil must be detuned during the transmit phase of other coils in the system or when other received coils are active. If the birdcage coil is not detuned during the transmit phase of other coils or when other received coils are active, cross coupling of the coils may cause detuning of all the coils of the system resulting in poor operation. Detuning of the coil requires that all of the components of the coil not be responsive to signals of a given frequency produced by the magnetic moments of the nuclei being sensed. It is also important for the coil to operate in quadrature in order to maximize the signal to noise ratio sensitivity of the coil. As shown in the aforementioned European Patent Application 0,142,760, it is preferred that a head coil be separated into two halves. This permits a patient to lie on a lower half and then the upper half is assembled to the lower half over the patient' head. Doctors prefer that the coil be split this way for optimum utilization.

As shown in the European patent application, each of the rods, disclosed as a segment, is connected at evenly spaced points around end conductive loops. Each of the segments includes at least one capacitive element. The coil is driven by a current source connected between terminals across one of the capacitive elements. As disclosed in FIG. 3a thereof, the capacitive elements are positioned approximately midway in the rods (segments). In the aforementioned article by Hayes et al, a birdcage coil also comprises rods connecting to circular end rings with capacitive elements midway in the segments. The problem with this structure is that the central position of the capacitive elements in the rod segments and the accompanying circuitry tend to cause the construction to be formed as a solid cylinder.

Detuning of the coil is typically achieved by switching an inductor across each capacitor of each rod. However, this embodiment requires large inductors which are even more bulky than employing PIN diodes as decoupling elements. Typically, the logical place for the PIN diodes is at the middle of each rod because that region of the rod is at the same potential as the center of other rods. The resulting circuitry and wiring necessary to couple the detuning circuitry typically effectively closes up the space between the rods. The present inventors recognize that a solid cylinder placed over a patient's head is discomforting to the patient and is not optimum for use by a physician. For example, physicians typically need to have access to a person's head during examination for connecting or disconnecting various medical equipment to the person, including tubes and other devices. Therefore it is preferred by the present inventors that a birdcage coil construction be provided with at least one half which is open to the ambient atmosphere. This permits the person's face enclosed by the coil to be accessible to a physician as well as permitting the person to be able to peer out of the coil to increase the patients comfort during an examination. Also, by providing an open upper half to the coil, increased ventilation for the patient during head imaging is provided. However, the prior art coils as discussed above as being representative of such birdcage constructions in employing capacitive elements midway in the segments provide structures which need to be enclosed. The enclosure provides support for accompanying circuitry and elements associated with the coil for operating the coil. These elements and circuitry typically are secured in the regions adjacent to the rods.

A radio frequency quadrature coil construction for use in a magnetic resonance imaging system in accordance with the present invention comprises a first electrically conductive annular ring and second and third spaced electrically conductive annular rings spaced from the first annular ring. The second and third annular rings are relatively closely spaced to one another and have a combined inductance substantially the same as the inductance of the first ring to thereby operate in circuit as a single ring. A plurality of spaced electrically conductive rods are coupled at one end thereof to the first ring and the other end to the second and third rings. Coil tuning and detuning means are coupled to the rods and rings for selectively tuning and detuning the structure formed by the rods and rings relative to a given radio frequency such that in response to a sensed given magnetic field, a quadrature signal of the given radio frequency is induced in the structure only when tuned.

This construction permits the tuning and detuning means to include switch means, for example PIN diodes, coupled to each of the rods at one end of the rods adjacent to the second and third rings for selectively tuning and detuning the coil. In this construction, by placing the PIN diodes at the ends of the rods and employing the second and third ring, a bias for the diodes can be coupled to the second and third ring for biasing the diodes on and off in accordance with the operating mode of the coil. As the diodes are biased with DC current, a separate bias current can be supplied on the second ring as compared to the bias applied to the third ring.

An advantage of this construction is that only two chokes need be employed to provide bias to all of the PIN diodes. In accordance with a feature of the invention, each of the rings are split and capacitively coupled to provide an annular conductive ring for rf signals and DC blocking for DC bias signals. A separate DC bias is provided to the so split rings to provide increased reverse bias to the diodes to ensure that the diodes are not foward biased during the excitation pulse.

IN THE DRAWING

Figure 1:
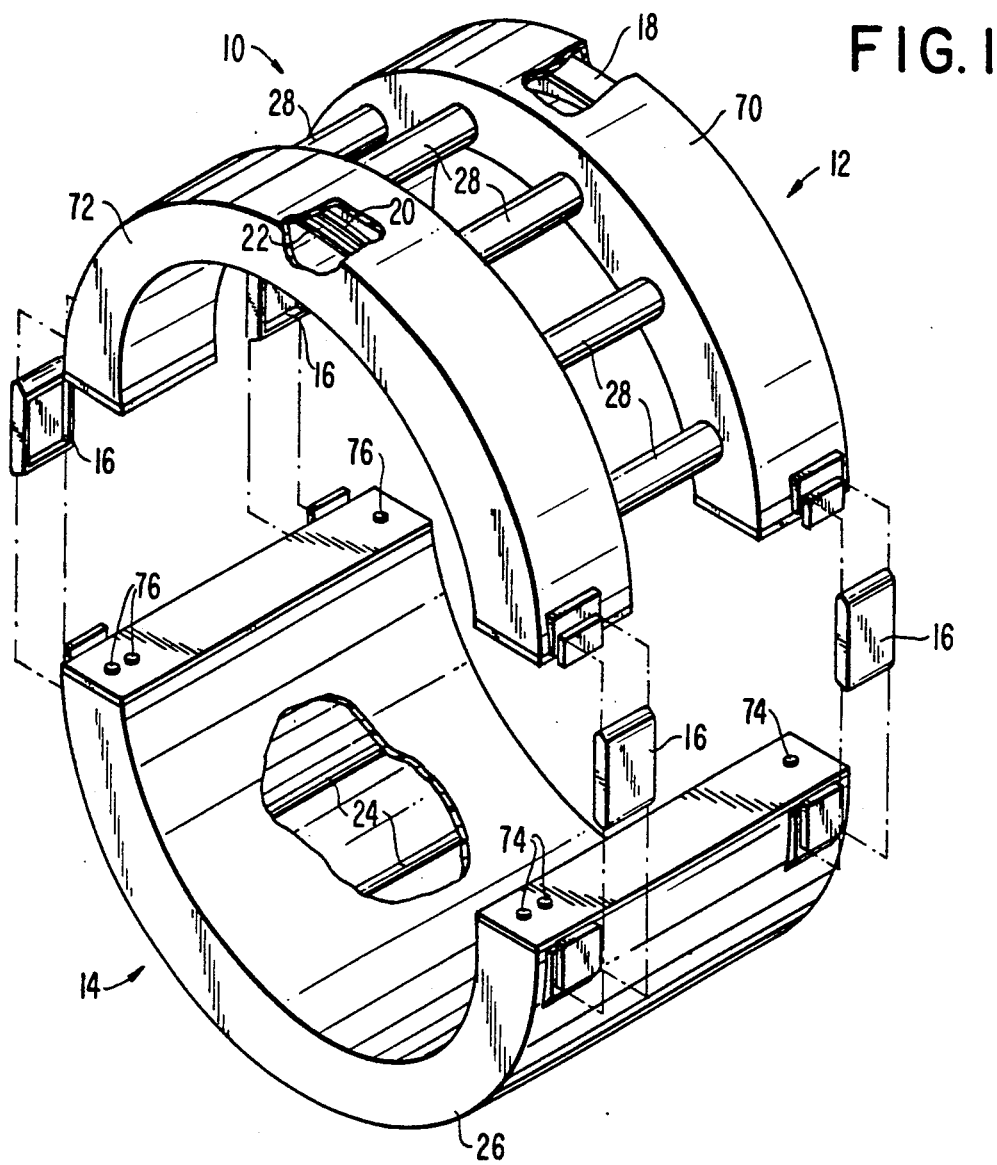
FIG. 1 is an isometric view of a coil construction in accordance with one embodiment of the present invention.

In FIG. 1, coil structure 10 comprises an upper half assembly 12 and a lower half assembly 14. Each of the assemblies 12 and 14 are semi-circular cylinders and are latched together as a circular cylindrical coil by latches 16. The lower half assembly 14 may be secured to a patient table in an operating mode via a cradle, not shown. The cradle positions the coil for use, for example, for examining a leg or a head of a patient. The circular coil structure 10 with the upper and lower halves engaged comprises a circular electrically conductive ring 18 at one end of the structure and at the other end a pair of spaced circular rings 20 and 22 of the same diameter as ring 18 and parallel therewith. Ring 18 is electrically coupled to rings 20 and 22 via elongated rods 24. The rods 24 are identically dimensioned and equally spaced about the structure.

In this embodiment, there are 12 rods 24 With six rods being secured in the upper half assembly 12 and six rods secured in the lower half assembly 14. The lower half assembly is enclosed by a housing 26. In the upper half of the assembly, the rods 24 each are enclosed with a circular tubular cylinder 28. The spacing between the cylinders 28 is open to the ambient atmosphere so that a patient head positioned within the core of the structure 10 and facing toward the top of the drawing can peer out in the space between the tubular cylinders 28. In addition, a doctor may observe the patient's face and may with his fingers insert or remove tubing or other devices from the patient's head without removing the coil structure 10. Further details of the mechanical construction of the structure 10 will be made later in connection with discussion of FIGS. 5, 6 and 7.

Figure 2:
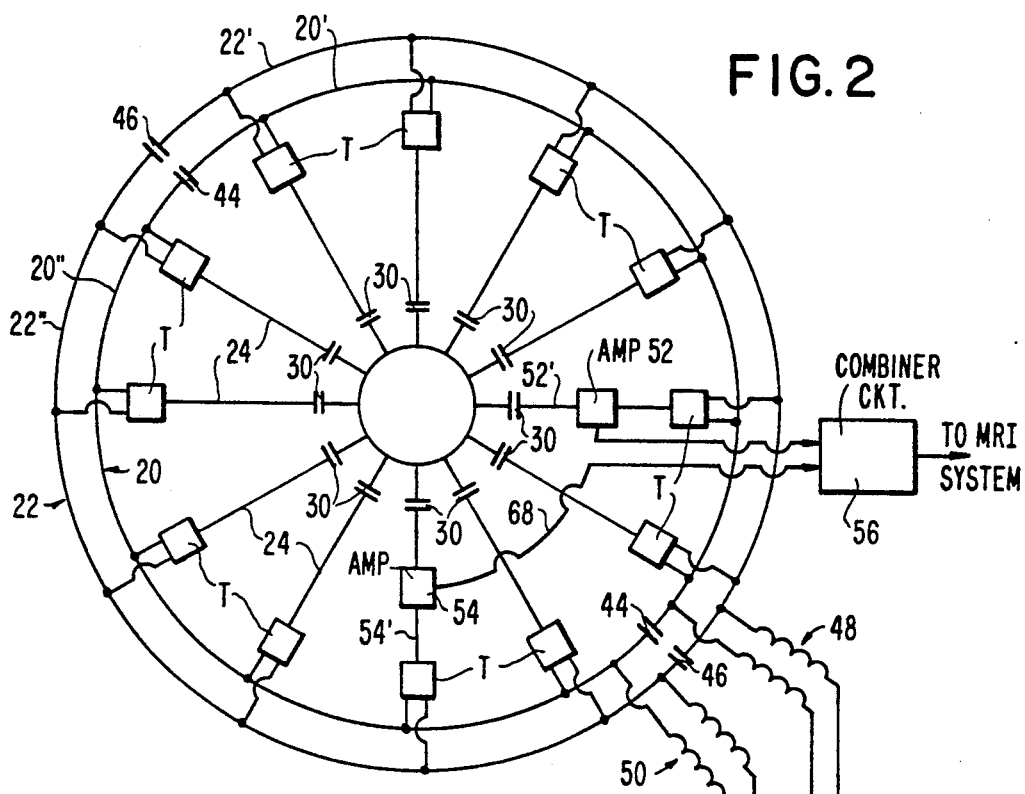
FIG. 2 is a circuit schematic diagram of the coil construction of FIG. 1.

In FIG. 2, a schematic diagram of the circuitry of the structure 10 of FIG. 1 is illustrated, however, the rings 18, 20 and 22 are shown as concentric circles rather than as equal diameter rings as they are in practice. The schematic diagram is shown in this scale for ease of illustration. It should be understood, however, that the rings 18, 20 and 22 are of the same diameter and that the ring 18 has substantially the same inductance as that of the combined rings 20 and 22. Each of the rods 24 is capacitively coupled at one rod end to the ring 18 via a capacitance 30. The other end of each of the rods 2 is selectively capacitively coupled to rings 20 and 22 by a tune and detune circuit T.

Figure 3:
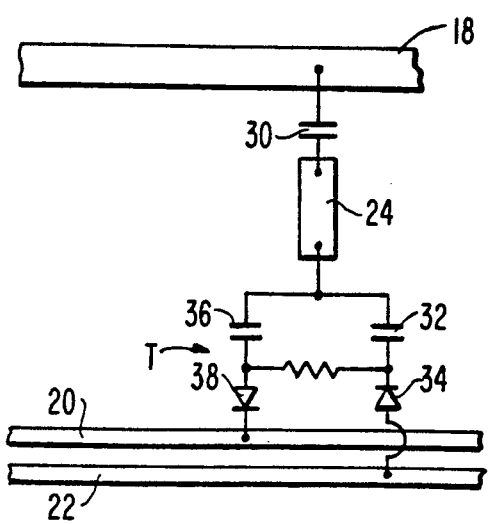
FIG. 3 is a circuit diagram of the connections of a typical rod to the annular rings of the diagram of FIG. 2 using a representative tune and detune circuit.

In FIG. 3, the tune and detune circuit T comprises a capacitance 32 coupled to ring 22 via a PIN diode 34. The cathode of the diode is coupled to the capacitance 32 and the anode is connected to the ring 22. The rod 24 is also connected at the same end to ring 20 via capacitance 36 and PIN diode 38. The capacitance 36 is coupled to the anode of diode 38 and the ring 20 is connected to the cathode of diode 38. Diodes 34 and 38 have the characteristics that when forward biased, that is when turned on, are bi-directional for rf signals of the frequency of interest; for example, 64 mhz. When the diodes are reverse biased, that is turned off, these diodes block the same rf signals. Thus, when the diodes are reversed biased, they change the tuning characteristics of the coil structure, i.e., detune the coil. A current limiting resistance 40 is connected at one end to the junction between capacitance 36 and diode 38 and at the other end to the junction between capacitance 32 and diode 34.

Typically in the prior art in similar coil structures, capacitances equivalent to capacitance 32 and 36 are placed in a rod 24 for coupling to a single ring corresponding to rings 20 and 22. However, a single capacitor used with the dual rings 20 and 22 produces an impedance imbalance in the system and would not provide optimum operation.

Normally, in operating the coil as a receive antenna, the body coil enclosing the patient produces an excitation field as discussed in the introductory portion. If the coil of FIG. 2 were tuned to the 64 mhz rf frequency of the MRI system, then the coil would be coupled to the magnetic field of the body coil, would accept the tuning of the body coil and cause malfunctioning of the system to the point where an optimum signal would not be produced. This occurs because, when the body coil is coupled to the local antenna, for example, structure 10, a shift in frequency of both antennas occurs which detunes both coils from the 64 mhz frequency of the system. As a result, this reduces the application of power to the coils. Therefore, to transmit, the system must be able to detune the local coil, before transmitting and must tune the local coil before it can receive. It is estimated that the time frame for turning on and off the body coil with respect to turning on and off the local coil must occur within a time period of 500 microseconds. That is, the diodes 34 or 38 must be switched on and off within a period of 500 microseconds in order for the system to operate in an optimum fashion. Normally, a typical radio frequency pulse applied by the body coil occurs in 10 milliseconds during the transmit mode. During the transmit mode, when that pulse is applied, the local coil structure 10 must be detuned. When the local coil is ready to receive, the body coil is turned off and the local coil must be turned on within that 500 microseconds.

The capacitances 32 and 36, FIG. 3, are matched to provide symmetry to the signals applied to and from the rod 24 and the rings 20 and 22. By placing the current limiting resistance 40 in the position as shown, the symmetry of the circuitry is maintained so that there is a balance in the values of the signals flowing between the rod 24 and rings 20 and 22. This balance of signal values in important in order to optimize the signal-to-noise ratio sensitivity of the coil.

In FIG. 2, ring 18 is electrically conductive for both DC and rf currents. However, the rings 20 and 22 each are bifurcated into two mating halves. For example, ring 20 comprises symmetrical semi-circular rings 20' and 20". The ring halves 20' and 20" are coupled by a pair of matched capacitors 44 of substantially the same value. Capacitors 44 couple the ring halves 20' and 20" with respect to rf energy but provide DC blocking to DC currents flowing in each of the ring halves. Similarly, the ring 22 is formed of two ring halves 22' and 22". The halves 22' and 22" are symmetrical mirror images as are halves 20' and 20". The halves 22' and 22" are connected by matched coupling capacitors 46. Capacitors 46 provide rf coupling of the halves 22' and 22" while providing DC blocking.

A DC bias control circuit 42 applies DC bias to the segment of the coil comprising ring halves 20' and 22' in one bias section and to ring halves 20" and 22" in a second bias section. The bias control circuit 42 applies DC bias voltage through one pair of chokes 48 to halves 20' and 22' and a second pair of chokes 50 to ring halves 20" and 22". The chokes 48 and 50 provide DC coupling and rf blocking between the control circuit 42 and the rings 20 and 22. The ring halve 20" and 22" act as a DC bus for the DC bias voltage applied via chokes 50 to the tune and detune circuits T coupled to halves 20" and 22". Similarly, the ring halves 20' and 22' act as a DC voltage bus for the DC voltages applied through chokes 48 by the control circuit 42. The capacitances 44 and 46 prevent the DC biases on the halves 20' and 22' from being coupled to the DC biases on halves 20" and 22". The control circuit 42 includes means (not shown) for timing the turning on and turning off of the tune and detune circuits T simultaneously by appropriately forward or reverse biasing the PIN diodes as discussed above in connection with FIG. 3.

The rings 20 and 22 are identical and form together a circular ring whose combined inductance is substantially the same as the inductance of ring 18. By way of example, the ring 18 is made of a copper conductor rectangular in cross section of a given width and thickness. The rings 20 and 22 are fabricated from an identical ring as ring 18 but split in half about the ring to form two mating identical rings. By way of further example, the ring 18 may be a copper conductor, one centimeter in width whereas the rings 20 and 22 are each one-half centimeter in width and are spaced apart approximately three and one-half millimeters. The rings may be fabricated from copper conductors of a thickness of one millimeter. Such copper conductors are commercially available. The spacing of the rings 20 and 22 should be sufficiently close so that these two rings form a combined inductance the same as that of the ring 18 in circuit therewith. The combined inductance of rings 20 and 22 must match the inductance of ring 18 to optimize the operation of the coil. While the rings 18, 20 and 22 are described with respect to one embodiment, it should be understood that annular rings of other cross section may be employed in accordance with a given implementation. For example, annular rings of circular or other shapes in cross section may be used.

The value of the capacitances 30, 32 and 36, FIG. 3, are determined to tune the coil system in accordance with the inductances presented by the rings 18, 20 and 22 in a given implementation. The advantage of providing a single DC bias control circuit 42 and the use of two rings minimizes the number of rf chokes, such as chokes 48 and 50 which need to be employed in circuit for biasing the PIN diodes. In prior art systems, a PIN diode for tuning and detuning a birdcage coil was typically employed associated with each rod, therefore, the DC bias circuitry required a pair of chokes for each rod. In a system employing 12 rods, therefore 24 chokes were used as compared to the present 4 chokes.

In using a single ring 20 or 22, it is believed that the diodes may not be sufficiently forward biased to keep the diodes on to reduce the losses of the system. As a result, the rings 20 and 22 are each split into the above-described two semi-circular sections 20', 20"and 22', 22", respectively. Each semi-circular section 20', 20", 22' and 22" has a separate DC bias applied thereto to thereby double the bias applied to the PIN diodes coupled to that section for a given applied bias voltage.

The coil structure 10 of the present invention is operated in quadrature in a receive mode with two preamplifiers 52 and 54, FIG. 2, coupled to rods 52' and 54' respectively. The amplifiers 52 and 54 are connected to the middle of rods 52' and 54' to insure symmetry of the received signals. The amplifiers 52 and 54 are connected to those rods which are enclosed in the lower assembly 14. It is important that the amplifiers 52 and 54 be connected to those rods which are oriented 90° relative to one another in order for the system to operate in quadrature. The outputs of amplifiers 52 and 54 are coupled to a combiner circuit 56 which combines the quadrature received 90° out of phase signals and applies the combined signals to the MRI imaging system via a coaxial cable (not shown).

Figure 4:
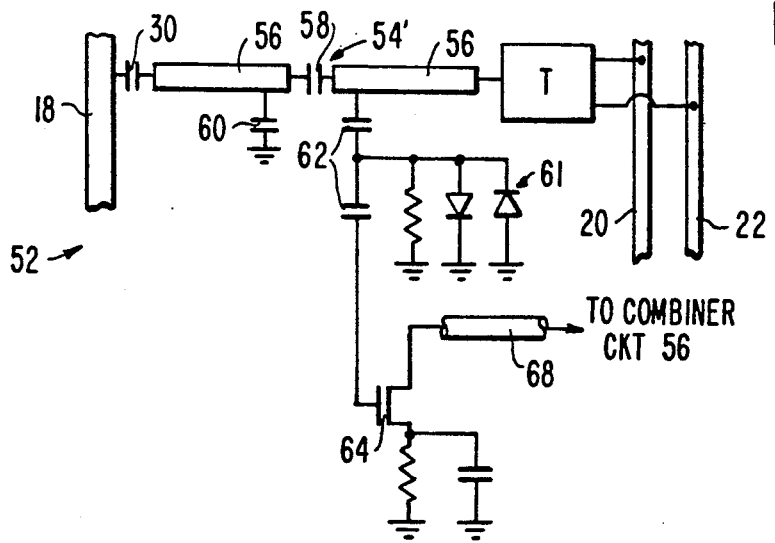
FIG. 4 is a circuit diagram of a representative preamplifier circuit for amplifying a signal produced by the embodiment of FIG. 1.

In FIG. 4, amplifier 52 is described, it being understood that this is representative of amplifier 54. The rod 54' comprises two identical rod segments 56. Segments 56 are coupled via central capacitance 58. Capacitance 58 provides an impedance across which a voltage drop is created from which an output signal may be detected in the coil structure. Normally the rod 54' receives a signal which needs to be sensed. The rod 52' for the other amplifier 52 exhibits a signal 90° out of phase with the signal on rod 54'. Capacitor 60 couples the rod 56 to ground to balance the system. Two coupling capacitances 62 are connected in series, with one of the capacitances 62 being connected to the other of rods 56 and the other of capacitances 62 being connected to the gate electrode of FET transistor 64. A decoupling network 61 is connected between the junction of capacitances 62 and ground. Network 61 includes a pair of parallel diodes oppositely coupled to ground and a resistance coupled in parallel to the diodes to decouple high voltage pulses generated by the excitation pulse from the transistor 64. The transistor 64 drain electrode is connected to a coaxial cable 68 applying the received signal to the combiner circuit 56, FIG. 2. The transistor 64 source electrode is coupled to ground through a parallel capacitance and resistance.

In operation of the circuit of FIG. 2, an excitation pulse is supplied by a system coil (not shown) to excite the patient's body part located within the coil structure 10, FIG. 1. Within 500 microseconds of the turnoff of the excitation pulse, the reverse bias of the diodes 34 and 38, FIG. 3, is removed by the DC bias applied to rings 20 and 22 via the control circuit 42, FIG. 2. The diodes are forward biased in this period via a DC voltage applied simultaneously through the chokes 48 and 50 to the respective ring halves 20', 22' and 20'', 22''. Chokes 48 and 50 block the rf energy during the excitation pulse from being applied to the DC bias control circuit 42. The diodes 34 and 38 of each tune and detune circuit T are simultaneously forward biased within the 500 microsecond period mentioned above and remain biased for the duration of the period in which the signals from the coil are to be sensed. The sensed 90° out of phase signals are detected and amplified by pre-amplifiers 52 and 54. The sensed signals are applied to the combiner circuit 56 where they are combined in-phase and the resulting in-phase signal applied to the MRI system.

The amplifiers 52 and 54 provide a high input impedance and, therefore, preclude the need for providing additional matching networks for the cable 68 relative to the coil. When the next excitation pulse is to be applied, the DC bias control circuit 42 reverse biases the PIN diodes of circuits T turning the PIN diodes off within the 500 microsecond period at which time the excitation pulse is commenced and the cycle repeated.

Figure 5:
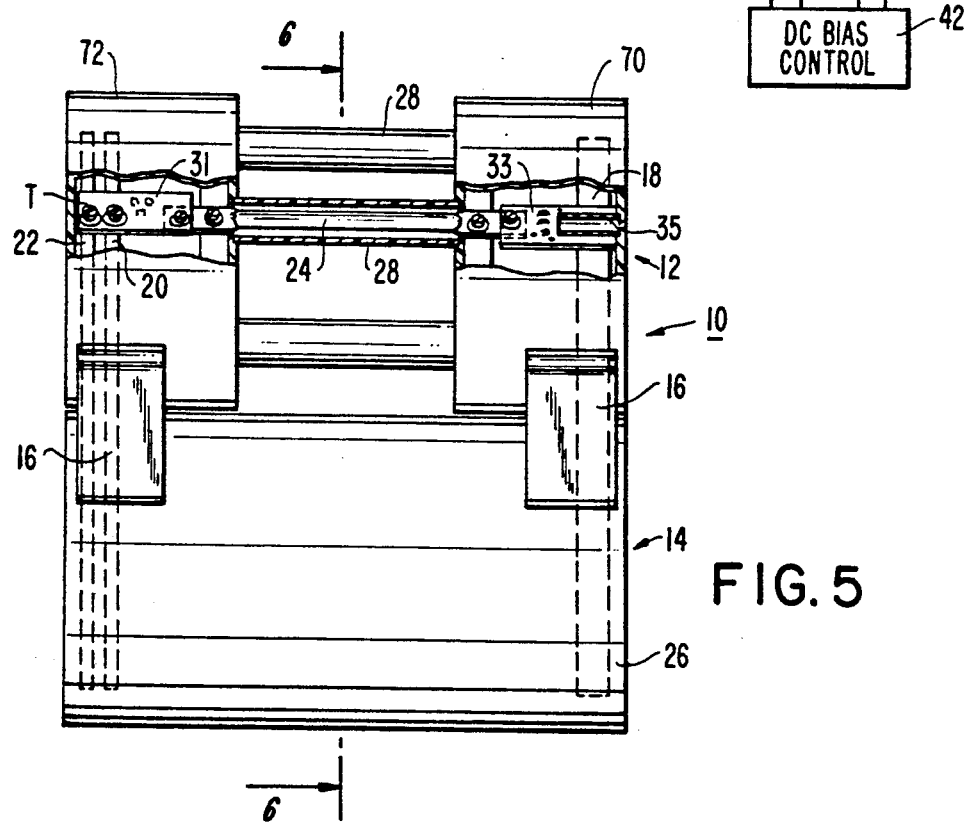
FIG. 5 is a side elevation view of the construction according to the embodiment of FIG. 1.
Figure 6:
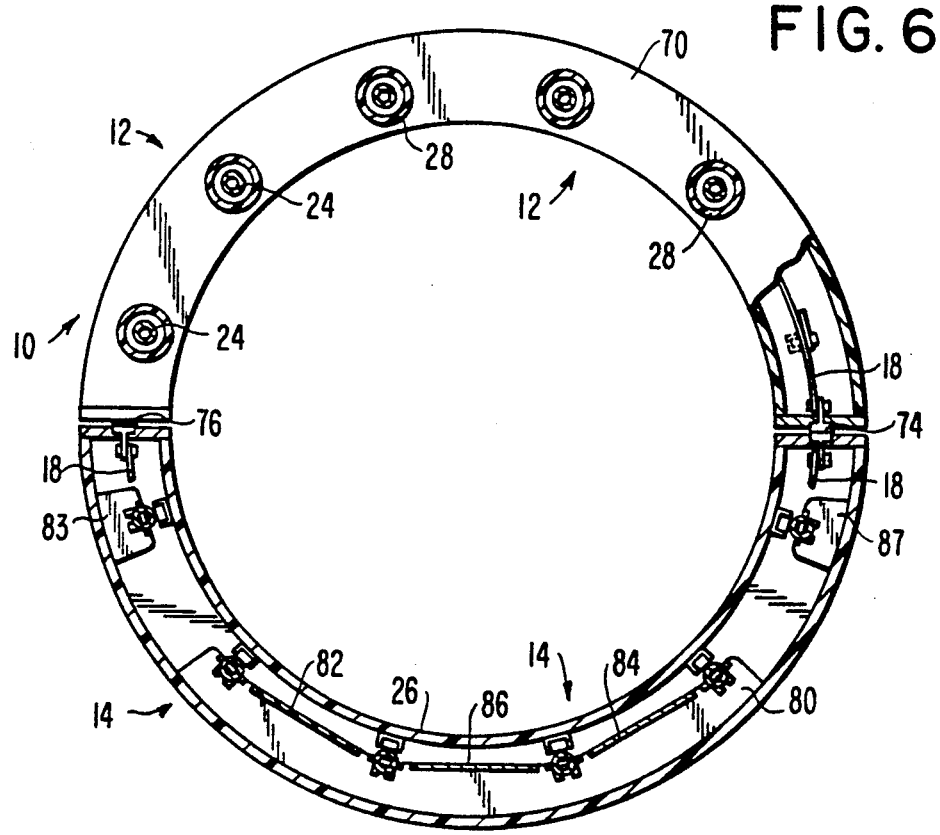
FIG. 6 is a sectional view of the construction of FIG. 5 taken along lines 6—6.

In FIG. 5, the structure 10 includes a pair of semi-circular hollow rectangular in-section rf transparent thermoplastic housings 70 and 72. A plurality of hollow thermoplastic tubes 28 are connected between the housing 70 and 72, each tube enclosing a rod 24. The housing 72 encloses circuitry elements including the tune and detune circuits T, the rings 20 and 22, the associated capacitances and the electrical connection means for connecting the rods 24 to the tune and detune circuits T as well as support structure for supporting the rings and rods at one end of the rods. A typical tuning circuit T is mounted on a circuit board 31. The circuit board 31 is mechanically and electrically connected at one end to one end of rod 24 and at the other end to rings 20 and 22. The housing 70 encloses the ring 18, a plurality of circuit boards 33 each for mounting a capacitance 30 and the mounting structure for the rods 24. A typical board 33 is mechanically and electrically coupled to the other end of each rod 24 and to ring 18. A thermoplastic tube 35 is at selected locations about ring 18 to permit access to a variable capacitance (not shown) on selected boards 33 to tune the coil.

The lower assembly 14 comprises a rectangular in section semi-circular cylindrical hollow structure for housing the relevant rods 24 and the lower semi-circular portions of rings 18, 20 and 22. Rings 18, 20 and 22 of the respective upper and lower assemblies 12 and 14 each include a contact 74 on one side of the coil and a contact 76 on the other side of the coil, FIG. 6. The contacts provide electrical continuity between the rings of the lower and upper assemblies 12 and 14. One contact is connected to the end of each ring half of these assemblies. A plurality of stanchions provide support for the ends of the rods 24, circuit boards and tubes 28 in the housing assembly 12. An elongated curved support structure 80 and stanchions 81 and 83 are provided in the lower assembly 14 for supporting the lower half rods at their ends and associated circuit boards. The circuit board 86 includes the combiner circuitry of circuit 56, FIG. 2, and the coaxial cable connections for connecting cables for connection to the MRI system. Circuit boards 82 and 84 contain the respective amplifier circuits of amplifiers 52 and 54.

Figure 7:
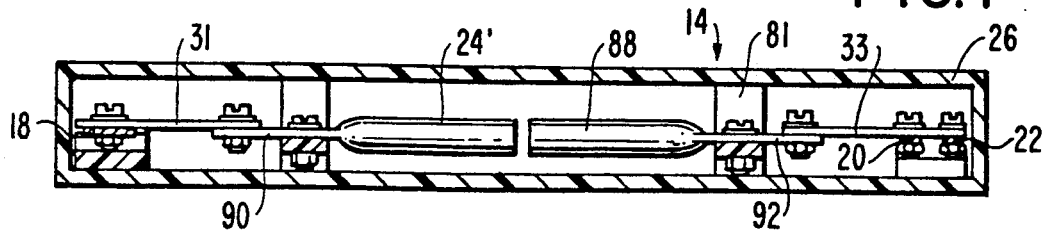
FIG. 7 is a sectional view through one of the rods of the embodiment of FIG. 1 in the upper half of the coil construction.

In FIG. 7, housing 26 enclosing the coil assembly of the lower assembly 14, is rectangular in section and comprises rf energy transparent material as does all of the housing materials. A typical rod 24' has a circular tubular central portion 88 and flattened end portions 90 and 92. The capacitances 30, 32 and 36 are surface mounted devices (SMD) (not shown) secured to the respective boards. The circuit boards rings and rods are fastened to one another and to the support stanchions by screws. The coil structure is rigid but yet simple to implement and use.

In use, the lower assembly 14 is assembled to a support cradle (not shown) and secured in place to a patient table. The patient rests a limb, for example a knee, or the head, on the lower assembly 14. The upper assembly 12 is then latched in place by latches 16. The mating respective contacts 76 and 74, only several of contacts 76 being shown in FIG. 1, on the upper and lower assemblies 12 and 14 are engaged to electrically releaseably couple the rings 18, 20 and 22 to one another.

What is claimed is:

1. A radio frequency (rf) quadrature coil construction for use in a magnetic resonance imaging (MRI) system comprising:

a first electrically conductive annular ring;

second and third spaced electrically conductive annular rings spaced from the first annular ring, said second and third annular rings being relatively closely spaced to one another and having a combined inductance substantially the same as the inductance of the first ring to thereby operate in circuit as a single ring;

a plurality of spaced electrically conductive rods coupled at one end thereof to said first ring and at the other end to said second and third rings; and coil tuning and detuning means coupled to said rods and rings for selectively tuning and detuning the structure formed by said rods and rings relative to a given radio frequency such that in response to a sensed given magnetic field a quadrature signal of said given radio frequency is induced in said structure only when tuned.

2. The construction of claim 1 wherein said tuning and detuning means includes switch means having open and closed states coupled to each said rods at one end thereof adjacent to said second and third rings for selectively tuning and detuning the construction in accordance with their state.

3. The construction of claim 2 wherein said switch means includes a PIN diode coupled between the second ring and the one end of each rod and between the third ring and the one end of each rod and diode bias means electrically connected to said second and third rings for selectively biasing said diodes on and off to respectively tune and detune said construction.

4. The construction of claim 2 wherein said tuning and detuning means comprises a first capacitor connected between the end of each said rods opposing said one end and said first ring and capacitance means connected between said switch means and each said rods at said rod one end.

5. The construction of claim 4 wherein said capacitance means comprises second and third capacitances of substantially the same value, each connected between a different diode and said one rod end and current limiting resistance connected to the junction between said second capacitance and one of said different diodes and to the junction between said third capacitance and the other of said different diodes.

6. The construction of claim 5 wherein said second and third capacitances have a combined in circuit capacitance value substantially the same as that of the first capacitance.

7. The construction of claim 6 further including amplifier means coupled to certain of said rods for receiving and amplifying the received signal produced in response to said sensed magnetic field.

8. The construction of claim 3 wherein said diode bias means comprises an rf choke coupled to each said second and third rings and DC bias supply means coupled to each said choke.

9. The construction of claim 8 wherein said second and third rings each comprise first and second halves coupled by rf coupling and direct current (DC) blocking means to permit rf current to flow throughout each ring and to preclude DC current from flowing from one half to the other half, said construction including a pair of said bias means, one pair being coupled to said first halves and the other pair being coupled to the second halves.

10. The construction of claim 1 wherein said rings are circular, said rings and rods forming a circular cylinder comprising first and second releasable cylindrical halves and further including contact means for electrically engaging the rings in an assembled state and latch means for urging said contact means and halves into engagement in said assembled state.

11. The construction of claim 10 wherein the space between the rods of one of said halves is open to the ambient atmosphere to permit visual observation of the interior of said cylinder through the space between the rods of said one half.

12. The construction of claim 10 wherein the tuning and detuning means are enclosed at said rod one ends.

13. A radio frequency (rf) quadrature coil construction for use in a magnetic resonance imaging (MRI) system comprising:

a first electrically conductive circular ring split into two mirror image halves;

second and third spaced electrically conductive circular rings spaced from the first annular ring, said second and third annular rings each being split into mirror image halves, said second and third rings being relatively closely spaced to one another and having a combined inductance substantially the same as the inductance of the first ring;

a plurality of spaced electrically conductive rods coupled at one end thereof to said first ring and at the other opposing end to said second and third rings;

capacitive tuning means coupled to said rods and rings for tuning the structure formed by said rods and rings to a given radio frequency such that in response to a sensed given magnetic field, a signal of said given radio frequency is induced in said structure; and switch means connected to said rods at the opposing ends and to said second and third rings for selectively coupling and decoupling said rods to said second and third rings with respect to a signal of said given frequency to thereby respectively tune and detune the structure.

14. The construction of claim 13 wherein said switch means includes a first diode having its cathode connected to said second ring and its anode connected to a rod opposing end via a first capacitance and a second diode having its cathode connected to said said latter rod opposing end via a second capacitance and its anode connected to said third ring, said tuning means including a third capacitance connected between the other opposing end of each said rods and the first ring, said first and second capacitances having a combined circuit value which matches the value of the third capacitance.

15. The construction of claim 14 including diode bias means connected to said second and third rings for selectively coupling said rods to said second and third rings at said given radio frequency.

16. The construction of claim 13 wherein said rods are equally spaced, said split rings forming first and second sets, half of said rods being coupled to one set of said split rings to form a first semicircular cylinder, the other half of said rods being coupled to the other set to form a second semicircular cylinder which mates with the first semicircular cylinder to form a circular cylindrical structure, contact means for electrically connecting the split rings and latch means for releasably securing the first and second cylinders and for engaging said contact means.

17. The construction of claim 16 including means for enclosing one of said semicircular cylinders and for providing open space to the ambient atmosphere between the rods of the other of said semicircular cylinders.

18. The construction of claim 13 wherein the rods are circular in cross section between the ends thereof and planar in a region at said rod ends, said tuning means including planar capacitances connected between said planar rod ends and said rings.

19. The construction of claim 13 including amplifier means coupled to certain of said rods for receiving and amplifying 90 degree phase shifted signals generated in response to said sensed magnetic field.

20. A radio frequency (rf) quadrature coil construction for use in a magnetic resonance imaging apparatus comprising:

a first annular ring of a given inductance;

at least one second annular ring of substantially the same inductance as said first ring;

a plurality of rods equally spaced from each other and capacitively coupled at one rod end to the first ring and at the other rod end to the at least one second ring to form the coil into a tuned circuit; and a detune circuit coupled between each rod one end and the at least one second annular ring for selectively rf decoupling the rods from the at least one ring.

21. The construction of claim 20 wherein said detune circuit includes a PIN diode coupled between said rod one end and said at least one ring and direct current bias means coupled to said at least one ring for biasing said diode.

* * * * *